(12) United States Patent
Gruner et al.

(10) Patent No.: US 8,305,558 B2
(45) Date of Patent: Nov. 6, 2012

(54) ILLUMINATION SYSTEM FOR A MICROLITHOGRAPHY PROJECTION EXPOSURE APPARATUS

(75) Inventors: Toralf Gruner, Aalen-Hofen (DE); Michael Totzeck, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 880 days.

(21) Appl. No.: 12/390,676

(22) Filed: Feb. 23, 2009

(65) Prior Publication Data

US 2009/0213356 A1 Aug. 27, 2009

Related U.S. Application Data

(63) Continuation of application No. PCT/EP2007/006463, filed on Jul. 20, 2007.

(30) Foreign Application Priority Data

Aug. 24, 2006 (DE) .......................... 10 2006 039 655

(51) Int. Cl.
*G03B 27/54* (2006.01)
*G03B 27/72* (2006.01)

(52) U.S. Cl. ........................................... 355/67; 355/71
(58) Field of Classification Search .................... 355/67, 355/71
See application file for complete search history.

(56) References Cited

U.S. PATENT DOCUMENTS

| 5,731,577 A * | 3/1998 | Tanitsu ....................... 250/201.5 |
| 5,896,438 A | 4/1999 | Miyake et al. |
| 6,400,794 B1 | 6/2002 | Schultz et al. |
| 6,498,351 B1 | 12/2002 | Kruizinga et al. |
| 2006/0152701 A1 | 7/2006 | Totzeck et al. |
| 2009/0201479 A1* | 8/2009 | Arai ................................ 355/67 |

FOREIGN PATENT DOCUMENTS

| DE | 103 58 225 | 6/2005 |
| EP | 1 076 906 | 10/2004 |
| JP | 2005-303084 | 10/2005 |
| WO | WO 2006080513 A1 * | 8/2006 |

OTHER PUBLICATIONS

J. Bahrdt et al., "Elliptically polarizing insertion devices at BESSY II," *Nuclear Instruments and Methods in Physics Research*, vol. 467-468, Jul. 21, 2001, pp. 21-29.

* cited by examiner

*Primary Examiner* — Minh-Toan Ton
*Assistant Examiner* — Michelle Iacoletti
(74) *Attorney, Agent, or Firm* — Fish & Richardson P.C.

(57) ABSTRACT

An illumination system for a microlithographic projection exposure apparatus includes an EUV light source which generates an emission beam of linearly polarized EUV illumination light. An illumination optics guides the emission beam along an optical axis which causes an illumination field in a reticle plane to be illuminated by the emission beam. The illumination system also includes an illumination subunit of the illumination system. The illumination subunit includes at least the EUV light source and a polarization setting device for setting a defined polarization of the EUV emission beam of the illumination subunit.

17 Claims, 2 Drawing Sheets

ILLUMINATION SYSTEM FOR A MICROLITHOGRAPHY PROJECTION EXPOSURE APPARATUS

CROSS-REFERENCE TO RELATED APPLICATION

This application is a continuation of, and claims benefit under 35 USC 120 to, international application PCT/EP2007/006463, filed Jul. 20, 2007, which claims benefit of German Application No. 10 2006 039 655.5, filed Aug. 24, 2006. International application PCT/EP2007/006463 is hereby incorporated by reference in its entirety.

FIELD

The disclosure relates to an illumination system for a microlithographic projection, a projection exposure apparatus including such an illumination system, a method of using such an apparatus to produce a microstructured component, and such microstructured components.

BACKGROUND

Illumination systems and microlithographic projection exposure apparatus are known. Systems of this type can operate with EUV illumination light having a wavelength of 13.6 nm. Currently light sources for systems of this type include plasma sources. Synchrotron radiation is an interesting alternative thereto. The known EUV lithography systems are usually equipped with Bragg mirrors as bundle-guiding components which are provided with coatings of individual layers having an optical thickness amounting to a fourth of the working wavelength, or coating systems derived therefrom. Coatings of this type often have a polarization-dependent effect. The polarization sensitivity of the optical components typically increases with increasing numerical aperture of the illumination or projection system as the finite angle at least of the marginal rays, which are incident at illumination angles that deviate the most from 90°, between the polarization vector and the illumination plane often can no longer be neglected. The creation of a high contrast ratio by illuminating a light-sensitive layer on a wafer or a substrate onto which a reticle structure, in other words a template, is projected using the projection exposure apparatus, can also depend on the polarization properties of the illumination light.

SUMMARY

In some embodiments, the disclosure provides an illumination system that is relatively flexibly adaptable to polarization requirements of the exposure apparatus and of the structure to be projected onto the substrate.

In certain embodiments, the disclosure provides an illumination system having an illumination subunit. The illumination subunit includes at least the EUV light source and a polarization setting device for setting a defined polarization of the EUV emission beam of the illumination subunit by a rotational and/or translational movement of the illumination subunit.

It has been found that via a polarization, which is adjustable in a defined manner, an EUV emission beam is well adaptable to the polarization requirements of the components of the illumination optics and of a projection optics which may be arranged downstream thereof. The polarization of the EUV emission beam may be adjusted in such a way for the illumination optics to have an optimized high EUV illumination light throughput. Furthermore, the polarization of the EUV emission beam is adaptable in such a way that the illumination and the projection, which may be arranged downstream thereof, are able to fulfil for instance contrast requirements. The polarization of the EUV light, which is adjustable in a defined manner, may be a linear polarization or another type of polarization, such as elliptical or circular polarizations.

A low-loss setting of a defined linear polarization of the emission beam may be achieved by arranging the EUV light source or an illumination subunit of the illumination system including the EUV light source for rotation about a portion of the optical axis, where the portion of the optical axis is arranged downstream of the illumination subunit and extends up to the nearest deflecting EUV bundle-guiding component. Thus, a low-loss setting of a defined linear polarization of the emission beam may be achieved by rotating the EUV light source or by rotating an illumination subunit of the illumination system including the EUV light source. A downstream lossy polarization of the emission beam in the desired polarization direction can be dispensed with. Depending on the desired polarization properties of the illumination system and the reticle structure to be imaged, the illumination subunit may be rotated to achieve the desired polarization of the emission beam. The polarization of the EUV emission beam may also be influenced otherwise than by rotating the illumination subunit. A rotation of components is usually not compulsory. Likewise, it is conceivable as well to influence the polarization of an EUV light source by translating components thereof. This is shown in DE 103 58 225 B3 by the example of an undulator of wiggler arrangement.

A rotatable undulator or wiggler arrangement of the EUV light source, which are in each case rotatable about the emission beam, can generate a properly linearly polarized EUV emission beam whose orientation is adjusted by rotating the illumination subunit or the light source.

A rotatable design of the EUV light source, which may be part of an illumination subunit, and of a downstream scattering component which are arranged for rotation about a portion of the optical axis, where the portion of the axis is arranged downstream of the scattering component and extends up to the nearest deflecting EUV bundle-guiding component, can reduce the demands on the downstream components that are co-rotated therewith since there is no need for them to guide various linear polarizations of the emission beam as the polarization of the emission beam does not change relative to the downstream component that is co-rotated therewith in the illumination subunit. The rotated polarization may not be effective until downstream of the rotatable illumination subunit.

A gradual setting of the polarization of the emission beam by a rotatable arrangement of the illumination subunit such that a linearly polarized emission beam with differently oriented polarization planes is generated, with adjacent orientations of the polarization planes being spaced from each other by pivot angles which are no greater than 10° (e.g., no greater than 5°), may for instance be obtained by a mechanical actuation mechanism such as a stepper motor or by mechanical stops. A setting accuracy of 5° or 10° is sufficient for many applications.

A continuously rotatable arrangement of the illumination subunit can help ensure a particularly fine adjustment of the polarization of the emission beam.

An illumination subunit which is rotatable at a presettable angular speed allows the setting of in particular effectively unpolarized EUV light. This may be used for homogenizing the EUV illumination.

A position control device of the emission beam which is arranged in such a way that downstream of the position control device, the actual beam direction of the emission beam deviates from a desired beam direction by no more than 100 mrad (e.g., no more than 20 mrad) can help avoid an unwanted dependence of the beam direction on the rotational position of the illumination subunit.

At least one replaceable beam-guiding component downstream of the illumination subunit which is held in place by a changing holder so as to be replaceable by a replacement beam-guiding component, with the beam-guiding properties of the beam-guiding component on the one hand and those of the replacement beam-guiding component on the other being configured for in each case differently oriented polarization planes of the emission beam, utilizes a polarization optimization of an illumination system for the respective beam-guiding components which are used.

Interchangeable beam-guiding components, which are held by the changing holder and are part of a device for setting an illumination setting of the illumination system, increase the flexibility when setting illumination settings of the illumination system.

In some embodiments, the disclosure provides a microlithographic projection exposure apparatus including an illumination system. In certain embodiments, the disclosure provides a microlithographic production method that is performable using the system and a component that is produced by the method.

In some embodiments, the disclosure provides a method that includes: providing a reticle and a wafer; projecting a structure on the reticle onto a light-sensitive layer of the wafer using a projection objective of a projection exposure apparatus; and generating a microstructure on the wafer.

BRIEF DESCRIPTION OF THE DRAWINGS

Embodiments will hereinafter be explained in more detail in conjunction with the drawings, in which.

DETAILED DESCRIPTION

Figure 1:
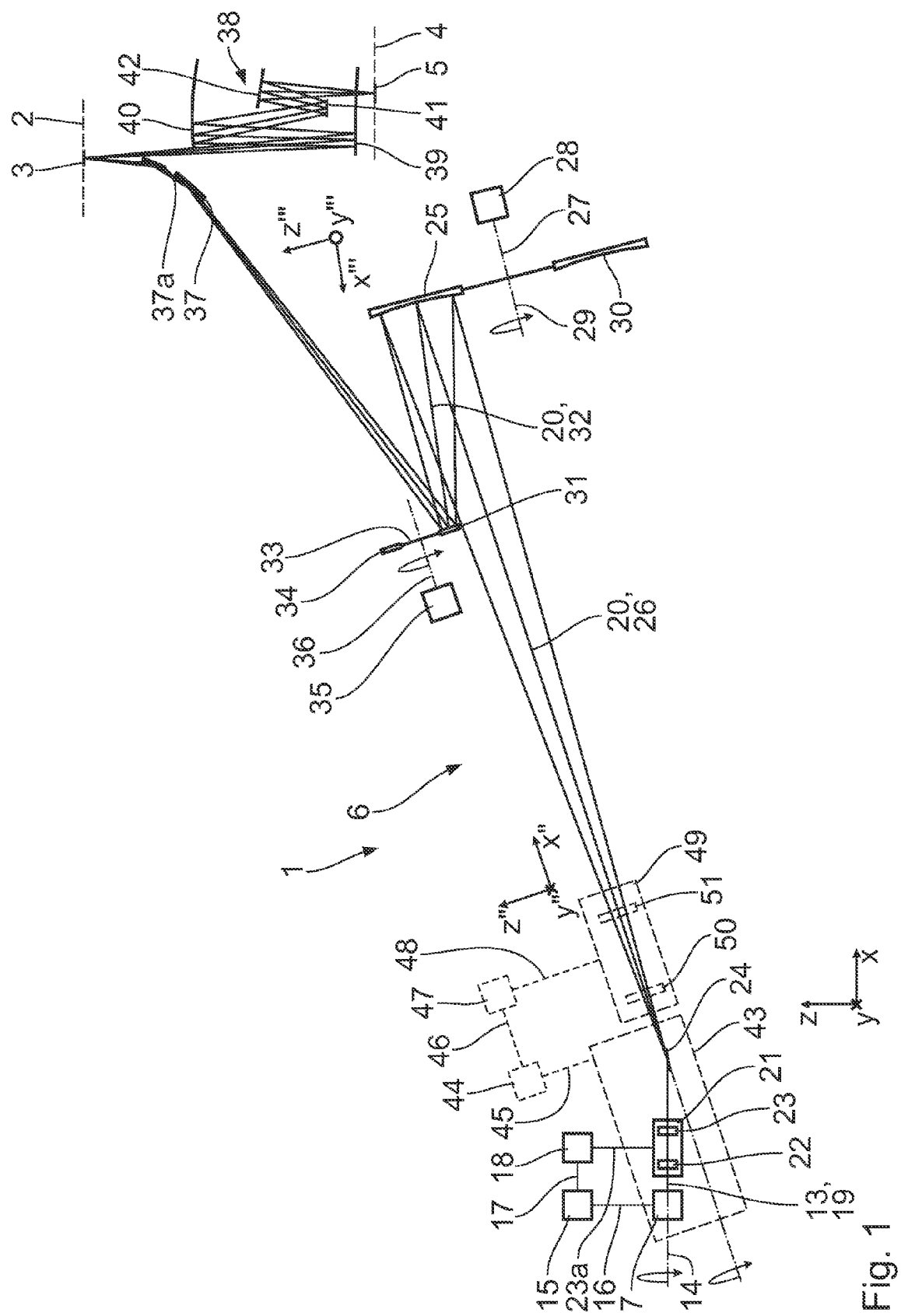
FIG. 1 shows a meridional section through a microlithographic projection exposure apparatus including an illumination system having an EUV light source, with two different embodiments of rotatable illumination subunits being shown.

A microlithographic projection exposure apparatus denoted by 1 in FIG. 1 is used to image a reticle 3, in other words a structural template which is arranged in a reticle plane 2, onto a wafer 5 arranged in a wafer plane 4. Suitable projection or illumination light is in this case EUV radiation, for instance in a wavelength range between 10 nm and 30 nm.

Figure 2:
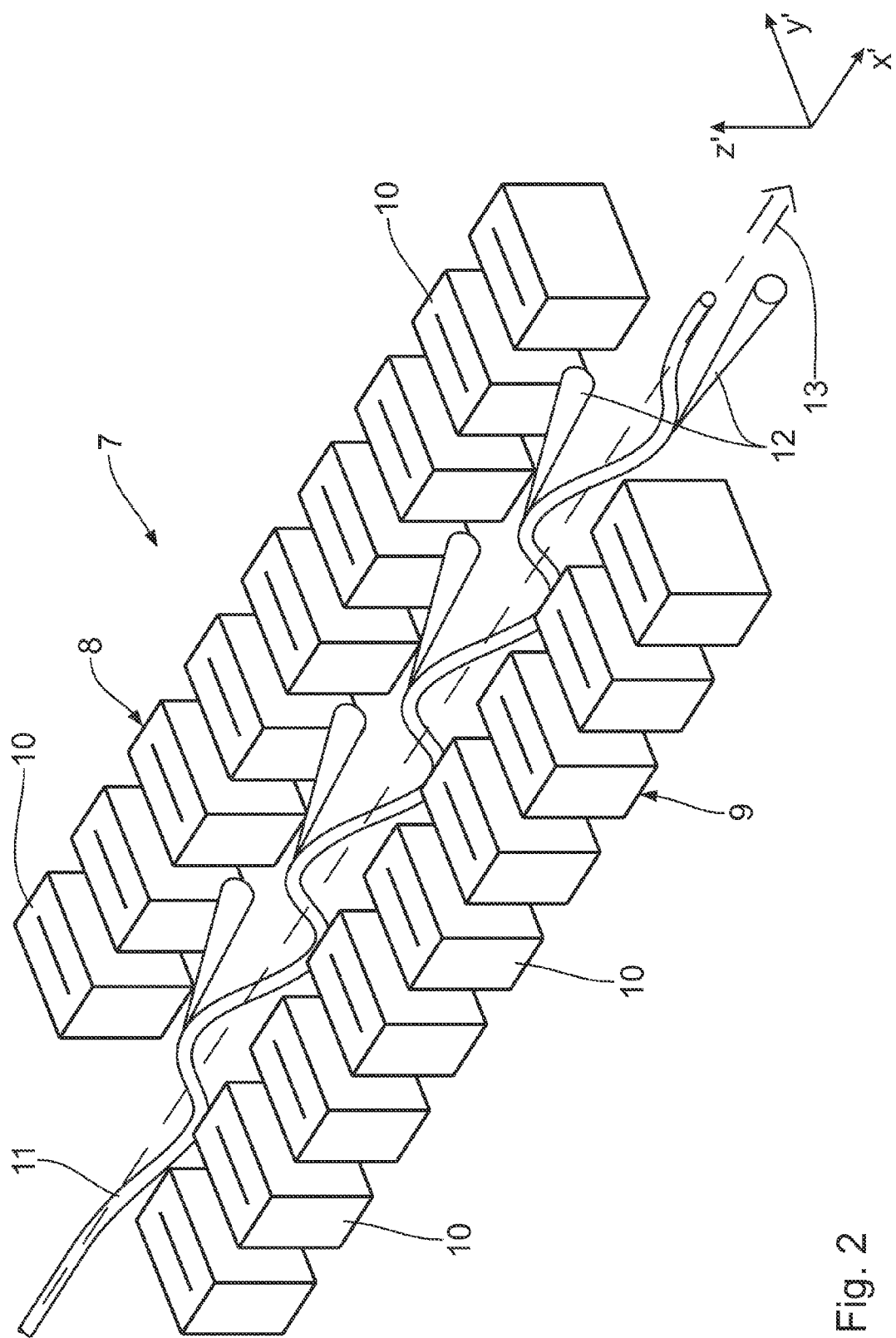
FIG. 2 shows an enlarged view of the EUV light source.

The light source of an illumination system 6 of the projection exposure apparatus 1 is an EUV light source 7 in the form of an undulator system which is shown in more detail in FIG. 2. Two rows 8, 9 of magnets 10, which are arranged in succession in an alternating north-south orientation, cause an electron beam 11 to move along an approximately sinusoidal path between the rows 8, 9. The electrons which are accelerated along the electron beam 11 emit radiation lobes 12 which have a positive mutual interference, and thus form an emission beam 13. After exiting the EUV light source 7, the emission beam 13 may be spectrally filtered. As an alternative to an undulator arrangement, a wiggler arrangement is suitable for use as an EUV light source.

The two rows 8, 9 of magnets 10 define an x'y' plane of a Cartesian x'y'z' coordinate system, shown in FIG. 2, of the EUV light source 7. The sinusoidal oscillation of the electron beam 11 propagates through the x'y' plane. Correspondingly, the emission beam 13 is linearly polarized in the x'z' plane.

The EUV light source 7 is rotatable about an axis of rotation 14 which coincides with the x'-axis. To this end, the entire EUV light source 7 is axially/radially mounted. The rotatable part of the EUV light source 7 is supplied with electrical power via corresponding wipers. Supply fluids are supplied via sealed coupling units which are sealed between the movable and a stationary part of the EUV light source 7.

The rotation of the EUV light source 7 about the axis of rotation 14 is actuated by a drive motor 15 which is mechanically connected to the EUV light source 7 for instance by a gear box, as outlined in FIG. 1 at 16. The drive motor 15 is connected to a control computer 18 of the projection exposure apparatus 1 via a signal line 17. The drive motor 15 allows the EUV light source 7 to be continuously rotated about the axis of rotation 14.

The direction of the emission beam 13 downstream of the EUV light source 7 defines a first portion 19 of an optical axis 20 of the projection exposure apparatus 1 up to the next bundle-guiding component for the emission beam 13. The axis of rotation 14 coincides with the first optical axis portion 19.

FIG. 1 shows a stationary Cartesian xyz-coordinate system below the EUV light source 7. The x-axis coincides with the x'-axis of the coordinate system of the EUV light source 7. The y-axis extends upwardly in FIG. 1 and is perpendicular to the drawing plane of FIG. 1 and to the z-axis.

As the EUV light source 7 is rotatable about the axis of rotation 14, the x'z'-plane of the EUV light source 7 may be arranged at any desired angle relative to the stationary xz-plane when the x-, x'-axes coincide with each other.

Consequently, in the stationary system, the linear polarization of the emission beam 13 in the x'y'-plane is continuously rotatable about the first optical axis portion 19.

A position control device 21 is arranged downstream of the EUV light source 7. The position control device 21 has two deflection components 22, 23 for the emission beam which are arranged in succession. The deflection components 22, 23 are shown schematically in FIG. 1. These components are usually reflective components. As is known from beam position control devices, the deflection components 22, 23 interact with position-sensitive EUV radiation detectors (not shown) and are tiltable about two axes in such a way that via the first deflection component 22, the point of incidence of the emission beam 13 on the second deflection component 23 is kept constant irrespective of the angular position of the EUV light source relative to the axis of rotation 14. The second deflection component 23 in turn interacts with another position-sensitive EUV detector and is actuated in such a way that the emission beam 13 is guided exactly along the first optical axis portion 19 by the second deflection component 23. This ensures that downstream of the position control device 21, the beam direction of the emission beam 13 remains constant irrespective of a rotational movement of the EUV light source 7 about the axis of rotation 14. The position control device 21 is connected to the control device 18 via a signal line 23a.

Downstream of the position control device 21, the emission beam 13 is deflected by a mirror 24 which is at the same time a scattering component for increasing the divergence of the emission beam 13. Downstream of the scattering component 24, the emission beam 13 impinges upon a field facet mirror 25. The field facet mirror 25 is the first component of an illumination optics for guiding the emission beam 13 along the optical axis 20. A second portion 26 of the optical axis 20 extends between the scattering component 24 and the field facet mirror 25. The second optical axis portion 26 and the drawing plane of FIG. 1 together define a Cartesian x"y"z"-coordinate system. The x"-axis extends along the second optical axis portion 26. The y"-axis extends perpendicular to the drawing plane of FIG. 1.

As is known from EUV illumination system of this type, the field facets of the field facet mirror 25 generate secondary light sources. The field facet mirror 25 is held in place by a changing holder 27. The changing holder is actuable by a drive motor 28 for rotation about an axis of rotation 29 which extends approximately parallel to the second optical axis portion 26. Along with the field facet mirror 25, the changing holder 27 carries additional field facet mirrors of which an additional field facet mirror 30 is shown in FIG. 1. In terms of their bundle-guiding properties, the field facet mirrors 25 and 30 are designed for emission beams 13 with differing linear polarization. Thus, the field facet mirror 25 is for instance designed for an emission beam which is linearly polarized in the x"z"-plane. The second field facet mirror 30 is for instance designed for an emission beam which is linearly polarized in the x"y"-plane.

A pupil facet mirror 31 is arranged downstream of the field facet mirror 25 when seen in the direction of the optical axis 20. At the position of the pupil facets of the pupil facet mirror 31, the secondary light sources are generated by the field facets of the field facet mirror 25. The pupil facet mirror 31 is arranged in the region of a pupil plane of an illumination optics of the illumination system 6, the illumination optics guiding the emission beam 13 to the reticle plane 2, and interacts with downstream components of the illumination optics for imaging the field facet mirror 25 into the reticle plane 2. The local distribution of the emission beam 13 on the pupil facet mirror 31 defines the illumination angle distribution in an illumination field of the illumination system 6 in the reticle plane 2. Between the field facet mirror 25 and the pupil facet mirror 31 is defined a third portion 32 of the optical axis. Together with the drawing plane of FIG. 1, the third optical axis portion 32 defines another x'''y''' coordinate system. The x'''-axis extends in the beam direction along the third optical axis portion 32. The y'''-axis extends perpendicular to the drawing plane of FIG. 1.

There is provided another changing holder 33 for the pupil facet mirrors which corresponds to the changing holder 27 for the field facet mirrors. Along with the pupil facet mirror 31, the changing holder 33 holds other pupil facet mirrors of which a pupil facet mirror 34 is shown in FIG. 1. The changing holder 33 is rotatable about an axis of rotation 36 by a drive motor 35, which permits an alternate use of the individual pupil facet mirrors 34. The pupil facet mirror 31 is for instance optimized for a polarization of the emission beam in the x'''z'''-plane. The other pupil facet mirror 34 is for instance optimized for a polarization of the emission beam 13 in the x'''y'''-plane.

The drive motors 28 and 35 are in a signal connection with the control computer 18.

Downstream of the pupil facet mirror 34, the emission beam 13 is guided to the reticle plane 2 by additional EUV mirrors 37, 37a. The illumination field in the reticle plane 2 is imaged into the wafer plane 4 by a projection objective 38 including reflecting EUV mirrors 39 to 42.

The optical configuration of the EUV illumination optics and of the projection objective 38 are known to those skilled in the art. The reflective components of the EUV illumination optics and of the projection optics 38 are layer systems including a plurality of high-reflectivity individual layers for reflecting EUV radiation as they are known to those skilled in the art. The reflectivity of these layer systems depends on the polarization of the incident EUV light.

The illumination system 6 works as follows: An illumination setting, in other words an illumination angle distribution for illuminating the illumination field in the reticle plane 2, is defined in a first step. The field facet mirror and the pupil facet mirror, which are suitable for generating this setting, are selected depending on the given illumination setting. The drives 28, 35 are then actuated to rotate these facet mirrors into the position of the facet mirror 25, 31 according to the illustration of FIG. 1. The field facet mirror 25 and the pupil facet mirror 31 are optimized for a particular linear polarization of the emission beam 13; this particular linear polarization is determined and set by rotating the EUV light source about the axis of rotation 14. If the facet mirrors 25, 31 are for instance optimized for x''' z''' and x'''y'''-polarization, the EUV light source 7 is rotated about the axis of rotation 14 in such a way that the z'-axis coincides with the z-axis. If the facet mirrors 25, 31 are alternatively optimized for a linear polarization in the x"y"- and in the x'''y'''-plane, the EUV light source 7 is rotated about the axis of rotation 14 until the z'-axis coincides with the y-axis.

The position control device 21 ensures that downstream of the position control device 21, the emission beam 13 is guided exactly along the optical axis, irrespective of the rotational position of the EUV light source.

As soon as the desired linear polarization of the emission beam 13 has been set, the reticle 3 is exposed to light and the structure thereof is projected onto an EUV-sensitive layer of the wafer 5. In this way, microstructures are generated on the wafer with an extremely high spatial resolution which microstructures may then be processed into microstructured components.

The EUV light source 7 may be continuously rotatable about the axis of rotation 14. Alternatively, the EUV light source 7 may be arranged for rotation in such a way that linearly polarized EUV illumination light can be generated with differently oriented polarization planes, with adjacent orientations of the polarization plane being spaced from each other by pivot angles which are no greater than 10° (e.g., no greater than 5°). The rotary drive 15 for the EUV light source 7 may also be designed in such a way that the EUV light source rotates continuously at a given angular speed. This generates an emission beam with a continuously rotating polarization plane, in other words an in particular effectively unpolarized emission beam, which allows unwanted polarization dependencies in the illumination or projection optics to be homogenized.

Via the position control device 21, the position of the emission beam 13 is controlled in such a way that an actual beam direction of the emission beam 13 deviates from a desired beam direction by no more than 100 mrad (e.g., no more than 20 mrad).

The above description refers to a rotatable embodiment where only the EUV light source 7 is rotatable. In some embodiments, an illumination subunit including additional bundle-guiding components of the illumination system may also be mounted for rotation along with the EUV light source 7. This will hereinafter be described by the dashed components shown in FIG. 1. In certain embodiments, the EUV light source 7 and the scattering component 24 are combined in one illumination subunit 43. The position control device 21 between the EUV light source 7 and the scattering component 24 are dispensed with. The drive motor 15 is dispensed with as well.

The entire illumination subunit 43 is mechanically coupled to a drive motor 44 for instance via a gear box, as outlined in FIG. 1 at 45. The drive motor 44 is in a signal connection with a control computer 47 via a signal line 46.

The control computer 47 is in a signal connection with the drive motors 28, 35 and, via a signal line 48, with a position control device 49 which includes deflecting components 50, 51 which are arranged in succession. The position control device 49 is stationarily, in other words non-rotatably, mounted between the scattering component 24 and the field facet mirror 25. The function of the position control device 49 corresponds to the one described above in relation to the position control device 21. Downstream of the position control device 49, the emission beam 13 is exactly in line with the optical axis 20. An actual beam direction deviates from a desired beam direction by no more than 100 mrad (e.g., no more than 20 mrad).

The EUV light source 7 or the illumination subunit 34 may also be pivotable instead of rotatable, in other words they need not be fully rotatable through 360°. The emission beam 13 may be set to any desired polarization plane even when using an embodiment which is pivotable through 180°, for example.

The drive motor 15 including the control computer 18 or the drive motor 44 including the control computer 47 are examples of a polarization setting device for setting a defined polarization of the EUV emission beam 13 downstream of the illumination subunit 7 or 43, respectively. Other polarization setting devices, which are not based on the rotation of components, are conceivable as well. Examples thereof are described in DE 103 58 225 B3. The polarization state may alternatively or additionally be influenced by a translational movement of the illumination subunit. A translational movement of the illumination subunit means the displacement of the illumination subunit relative to the other components of the illumination system or, alternatively, the displacement of components of the illumination subunit relative to each other.

What is claimed is:

1. An illumination system, comprising:
    an illumination subunit, comprising:
        an EUV light source configured to generate an emission beam of linearly polarized EUV illumination light; and
        a polarization setting device configured to set a defined polarization of the EUV emission beam of the illumination subunit by at least one movement selected from the group consisting of a rotational movement of the illumination subunit and a translational movement of the illumination subunit;
    an illumination optics configured to guide the emission beam along an optical axis to illuminate an illumination field in a plane with the emission beam;
    a nearest deflecting EUV bundle-guiding component; and
    a scattering component configured to increase divergence of the emission beam, wherein:
        the illumination subunit can be rotated about a portion of the optical axis that is arranged downstream of the illumination subunit and extends up to the nearest deflecting EUV bundle-guiding component;
        the EUV light source and the scattering component are arranged to be rotated about a portion of the optical axis that is downstream of the scattering component and extends up to the nearest deflecting EUV bundle-guiding component; and
        the illumination system is configured to be used in a microlithographic projection exposure apparatus.

2. An illumination system according to claim 1, wherein the EUV light source comprises an arrangement selected from the group consisting of an undulator arrangement and a wiggler arrangement which is rotatable about the emission beam.

3. An illumination system according to claim 1, further comprising a rotatable arrangement of the illumination subunit configured to generate a linearly polarized emission beam with differently oriented polarization planes, with adjacent orientations of the polarization planes being spaced from each other by pivot angles which are no greater than 10°.

4. An illumination system according to claim 3, wherein the adjacent orientations of the polarization planes are spaced from each other by pivot angles which are no greater than 5°.

5. An illumination system according to claim 1, further comprising a continuously rotatable arrangement of the illumination subunit.

6. An illumination system according to claim 1, further comprising an illumination subunit rotatable at a presettable angular speed.

7. An illumination system according to claim 1, further comprising a position control device of the emission beam, the position control device being arranged so that downstream of the position control device, the actual beam direction of the emission beam deviates from a desired beam direction by no more than 100 mrad.

8. An illumination system according to claim 7, wherein the actual beam direction of the emission beam deviates from a desired beam direction by no more than 20 mrad.

9. An illumination system according to claim 1, further comprising at least one beam-guiding component downstream of the illumination subunit, the beam-guiding component held in place by a changing holder so as to be replaceable by a replacement beam-guiding component, with the beam-guiding properties of the beam-guiding component and those of the replacement beam-guiding component being configured for in each case differently oriented polarization planes of the emission beam.

10. An illumination system according to claim 9, wherein the replaceable beam-guiding component, which is held by the changing holder, is part of a device for setting an illumination setting of the illumination system.

11. An apparatus, comprising:
    the illumination system of claim 1, wherein the apparatus is a projection exposure apparatus.

12. The apparatus of claim 11, further comprising a projection objective.

13. The apparatus of claim 12, wherein the apparatus is configured so that a reticle can be positioned between the illumination system and the projection objective.

14. An apparatus, comprising:
    the illumination system of claim 5,
    wherein the apparatus is a projection exposure apparatus.

15. The apparatus of claim 14, further comprising a projection objective.

16. The apparatus of claim 15, wherein the apparatus is configured so that a reticle can be positioned between the illumination system and the projection objective.

17. A method, comprising:
    using an apparatus to produce a microstructured component by:
        projecting a structure on a reticle onto a light-sensitive layer of a wafer using a projection objective of the projection exposure apparatus; and
        generating the microstructured component which comprises a microstructure on the wafer,
    wherein the apparatus is a projection exposure apparatus that comprises the illumination system of claim 1.

* * * * *

UNITED STATES PATENT AND TRADEMARK OFFICE
CERTIFICATE OF CORRECTION

PATENT NO. : 8,305,558 B2  
APPLICATION NO. : 12/390676  
DATED : November 6, 2012  
INVENTOR(S) : Toralf Gruner and Michael Totzeck Page 1 of 1

It is certified that error appears in the above-identified patent and that said Letters Patent is hereby corrected as shown below:

Column 1, line 11, delete "10 2006 039 655.5" and insert --10 2006 039 655.3--;

Column 5, line 38, delete "x'''y''''" and insert --x'''y'''z'''--;

Column 6, line 14, delete "x''' z''' and" insert --x"z"- and--.

Signed and Sealed this  
Twenty-ninth Day of January, 2013

David J. Kappos  
*Director of the United States Patent and Trademark Office*